(12) United States Patent
Ma et al.

(10) Patent No.: US 10,274,768 B2
(45) Date of Patent: Apr. 30, 2019

(54) DISPLAY APPARATUS AND METHOD OF MANUFACTURING THE SAME

(71) Applicants: BOE Technology Group Co., Ltd., Beijing (CN); BOE (Hebei) Mobile Display Technology Co., Ltd., Hebei (CN)

(72) Inventors: Nan Ma, Beijing (CN); Weidong Wang, Beijing (CN); Weiwei Zhao, Beijing (CN)

(73) Assignees: BOE TECHNOLOGY GROUP CO., LTD., Beijing (CN); BOE (HEBEI) MOBILE DISPLAY TECHNOLOGY CO., LTD., Hebei (CN)

( * ) Notice: Subject to any disclaimer, the term of this patent is extended or adjusted under 35 U.S.C. 154(b) by 4 days.

(21) Appl. No.: 15/531,558

(22) PCT Filed: Jun. 15, 2016

(86) PCT No.: PCT/CN2016/085793
§ 371 (c)(1),
(2) Date: May 30, 2017

(87) PCT Pub. No.: WO2017/166437
PCT Pub. Date: Oct. 5, 2017

(65) Prior Publication Data
US 2018/0095325 A1   Apr. 5, 2018

(30) Foreign Application Priority Data

Mar. 31, 2016  (CN) .......................... 2016 1 0200097

(51) Int. Cl.
*G02F 1/1333* (2006.01)
*G02F 1/1335* (2006.01)
*H01L 33/00* (2010.01)

(52) U.S. Cl.
CPC .. *G02F 1/133308* (2013.01); *G02F 1/133528* (2013.01); *G02F 1/133602* (2013.01);
(Continued)

(58) Field of Classification Search
CPC ......... G02F 1/133528; G02F 1/133308; G02F 1/133602; G02F 1/133608; G02F 2202/28;
(Continued)

(56) References Cited

U.S. PATENT DOCUMENTS 9,341,874 B2   5/2016  Jeong
2011/0164212 A1*  7/2011  Yeh ........................ G02F 1/1339
349/106

(Continued)

FOREIGN PATENT DOCUMENTS

CN   102902086 A   1/2013
CN   203217204 U   9/2013
(Continued)

OTHER PUBLICATIONS

English translation of CN105242451A, Title: Narrow-frame display device and manufacturing method therefor, Author: Wang Ruiwen; Ni Manli; Zou Shaolin ; Date of publication: Jan. 13, 2016.*
(Continued)

*Primary Examiner* — Shan Liu
(74) *Attorney, Agent, or Firm* — Westman, Champlin & Koehler, P.A.

(57) ABSTRACT

Embodiments of the present disclosure disclose a display apparatus and a method of manufacturing the display apparatus. A display panel includes a liquid crystal cell, a lower polarization filter, and a layer of which at least a pair of edges protrude beyond the liquid crystal cell. Adhesive layers are disposed on side surfaces of the display module. In any one of the side surfaces of the display module, the (Continued)

adhesive layer is adhered to side surfaces of the backlight module, of the lower polarization filter, and of the liquid crystal cell, and a surface, facing towards the backlight module, of the edge of the layer protruding beyond the liquid crystal cell, and has a thickness in a direction perpendicular to the side surface of the liquid crystal cell to which the adhesive layer is adhered, and the thickness is less than or equal to a selected thickness.

5 Claims, 5 Drawing Sheets

(52) U.S. Cl.
CPC ...... G02F 1/133608 (2013.01); H01L 33/005 (2013.01); *G02F 2001/133325* (2013.01); *G02F 2001/133331* (2013.01); *G02F 2202/28* (2013.01)

(58) Field of Classification Search
CPC ........ G02F 2001/133331; G02F 2001/133311; G02F 2001/133314; G02F 2001/133317; G02F 2001/13332; G02F 2001/133322; G02F 2001/133325; G02F 2001/133328; G02F 2001/133334; H01L 33/005
USPC ..................................... 349/58–60
See application file for complete search history.

(56) References Cited

U.S. PATENT DOCUMENTS

| | | | | |
|---|---|---|---|---|
| 2012/0094568 | A1* | 4/2012 | Miyazaki | B32B 37/1018 445/3 |
| 2013/0027857 | A1* | 1/2013 | Jeong | G02F 1/133308 361/679.01 |
| 2013/0263488 | A1* | 10/2013 | Wu | G02B 6/0088 40/773 |
| 2014/0160694 | A1* | 6/2014 | Yoon | G02F 1/1303 361/749 |
| 2014/0176848 | A1* | 6/2014 | Gupta | C03B 33/0222 349/58 |
| 2014/0176863 | A1 | 6/2014 | Oohira | |
| 2014/0204293 | A1* | 7/2014 | Kim | G02F 1/133351 349/15 |
| 2014/0231001 | A1* | 8/2014 | Tsai | B32B 37/1284 156/247 |
| 2015/0177540 | A1* | 6/2015 | Araki | G02F 1/1339 349/42 |
| 2015/0241731 | A1* | 8/2015 | Jeong | G02B 6/009 349/58 |
| 2016/0154271 | A1* | 6/2016 | Kim | G02F 1/133308 349/58 |
| 2016/0309598 | A1* | 10/2016 | Yamaguchi | G09F 9/30 |
| 2017/0368814 | A1* | 12/2017 | Usui | B32B 37/1284 |

FOREIGN PATENT DOCUMENTS

| | | | |
|---|---|---|---|
| CN | 204406002 U | | 6/2015 |
| CN | 105242451 | | 1/2016 |
| CN | 105242451 A | * | 1/2016 |
| CN | 105607328 A | | 5/2016 |

OTHER PUBLICATIONS

First Office Action, including Search Report, for Chinese Patent Application No. 201610200097.X, dated Dec. 27, 2017, 20 pages.
International Search Report and Written Opinion for International Application No. PCT/CN2016/085793, dated Dec. 28, 2016, 12 pages.
English translation of International Search Report and Written Opinion for International Application No. PCT/CN2016/085793, 18 pages.

* cited by examiner

DISPLAY APPARATUS AND METHOD OF MANUFACTURING THE SAME

CROSS-REFERENCE TO RELATED APPLICATIONS

This application is a Section 371 National Stage Application of International Application No. PCT/CN2016/085793, filed on 15 Jun. 2016, entitled "DISPLAY APPARATUS AND METHOD OF MANUFACTURING THE SAME", which has not yet published, which claims priority to Chinese Application No. 201610200097.X, filed on 31 Mar. 2016, incorporated herein by reference in their entirety.

BACKGROUND

1. Technical Field

Embodiments of the present disclosure relate to the field of display technology, and particularly to a display apparatus and a method of manufacturing the display apparatus.

2. Description of the Related Art

When a backlight module and a display panel in a conventional display apparatus are assembled, it is necessary to adhere a black adhesive tape to a region of the display panel outside an effective display region, between the backlight module and the display panel, so as to bond the backlight module and the display panel. Generally, the black adhesive tape has a width of 0.55 mm, and it is necessary to preserve a clearance of about 0.3 mm between the black adhesive tape and an edge of the effective display region of the display panel.

Therefore, a frame of the display apparatus is limited by the width of the black adhesive tape and the clearance between the black adhesive tape and the edge of the effective display region of the display panel. It is very difficult to manufacture the frame of the display apparatus to have a width of 0.9 mm or less, which is unfavorable for achieving a narrow-frame design of the display apparatus.

SUMMARY

Embodiments of the present disclosure provide a display apparatus comprising: a display module comprising a display panel and a backlight module overlapping each other, wherein, the display panel comprises a liquid crystal cell, a lower polarization filter located on a side of the liquid crystal cell facing towards the backlight module, and a layer which is located on a side of the liquid crystal cell facing away from the backlight module and of which at least a pair of edges protrude beyond the liquid crystal cell, adhesive layers are disposed on side surfaces of the display module where the edges of the layer protrude beyond the liquid crystal cell, in any one of the side surfaces of the display module where the adhesive layers are disposed, the adhesive layer is adhered to a side surface of the backlight module, a side surface of the lower polarization filter, a side surface of the liquid crystal cell, and a surface, facing towards the backlight module, of the edge of the layer protruding beyond the liquid crystal cell, and the adhesive layer has a thickness in a direction perpendicular to the side surface of the liquid crystal cell to which the adhesive layer is adhered, and the thickness is less than or equal to a selected thickness.

In an embodiment of the present disclosure, the selected thickness is 0.1 mm.

In an embodiment of the present disclosure, the display panel comprises an upper polarization filter located on a side of the liquid crystal cell facing away from the backlight module and serving as the layer.

In an embodiment of the present disclosure, the display panel comprises an upper polarization filter and a transparent cover plate which are located on a side of the liquid crystal cell facing away from the backlight module, and the transparent cover plate is located on a side of the upper polarization filter facing away from the liquid crystal cell and serves as the layer.

In an embodiment of the present disclosure, in any one of the side surfaces of the display module where the adhesive layers are disposed, the upper polarization filter protrudes beyond the liquid crystal cell by a width which is less than or equal to 0.1 mm.

In an embodiment of the present disclosure, in any one of the side surfaces of the display module where the adhesive layers are disposed, an edge of the transparent cover plate protrudes beyond the liquid crystal cell by a width which is in the range of 0.3 mm to 0.5 mm.

In an embodiment of the present disclosure, in any one of the side surfaces of the display module where the adhesive layers are disposed, the liquid crystal cell protrudes beyond a side surface of the backlight module.

In an embodiment of the present disclosure, the liquid crystal cell protrudes beyond the side surface of the backlight module by a width of 0.1 mm.

In an embodiment of the present disclosure, the adhesive layers are formed of a hot melt adhesive or an ultraviolet curable adhesive.

Embodiments of the present disclosure provide a method of manufacturing a display apparatus, the method comprising: overlapping a display panel and a backlight module, wherein: the display panel comprises a liquid crystal cell, a lower polarization filter located on a side of the liquid crystal cell facing towards the backlight module, and a layer which is located on a side of the liquid crystal cell facing away from the backlight module and of which at least a pair of edges protrude beyond the liquid crystal cell; and surfaces, facing towards the backlight module side, of the edges of the layer protruding beyond the liquid crystal cell, and side surfaces of the liquid crystal cell and of the backlight module form adhesive application regions; applying an adhesive in the adhesive application regions; curing the applied adhesive such that the cured adhesive is adhered to the side surfaces of the backlight module, side surfaces of the lower polarization filter, the side surfaces of the liquid crystal cell, and the surfaces, facing towards the backlight module side, of the edges of the layer protruding beyond the liquid crystal cell; and removing a superfluous portion of the cured adhesive to obtain adhesive layers, wherein each of the adhesive layers has a thickness in a direction perpendicular to the side surface of the liquid crystal cell to which the each of the adhesive layers is adhered, and the thickness is less than or equal to a selected thickness.

In an embodiment of the present disclosure, the display panel comprises an upper polarization filter located on a side of the liquid crystal cell facing away from the backlight module and serving as the layer.

In an embodiment of the present disclosure, edges of the upper polarization filter protruding beyond the liquid crystal cell have a selected initial width; the applying the adhesive in the adhesive application regions comprises: applying, in each of the adhesive application regions, an adhesive that has a thickness in a direction perpendicular to the side surface, corresponding to the each of the adhesive application regions, of the liquid crystal cell, wherein the thickness is greater than or equal to the selected initial width; and the removing the superfluous portion of the cured adhesive to obtain the adhesive layers comprises: cutting the upper polarization filter while removing the superfluous portion of the cured adhesive to obtain the adhesive layers, such that the edges of the upper polarization filter protruding beyond the liquid crystal cell have a width which is less than or equal to a selected value.

In an embodiment of the present disclosure, the method further comprises: adhering a transparent cover plate on a side of the upper polarization filter facing away from the liquid crystal cell, after removing the superfluous portion of the cured adhesive to obtain the adhesive layers.

In an embodiment of the present disclosure, the selected initial width is 0.3 mm, and the initial thickness of the adhesive is in the range of 0.3 mm-0.5 mm.

In an embodiment of the present disclosure, in the applying the adhesive in the adhesive application regions, the upper polarization filter is provided with a pressing force directed towards the backlight module, and the backlight module is provided with a pressing force directed towards the upper polarization filter.

In an embodiment of the present disclosure, the display panel comprises: an upper polarization filter and a transparent cover plate which are located on a side of the liquid crystal cell facing away from the backlight module, and the transparent cover plate is located on a side of the upper polarization filter facing away from the liquid crystal cell and serves as the layer.

In an embodiment of the present disclosure, the applying the adhesive in the adhesive application regions comprises applying, in each of the adhesive application regions, an adhesive that has a thickness in a direction perpendicular to the side surface, corresponding to the each of the adhesive application regions, of the liquid crystal cell, wherein the thickness is in the range of 0.3 mm to 0.5 mm.

In an embodiment of the present disclosure, the removing the superfluous portion of the cured adhesive to obtain the adhesive layers comprises removing the superfluous portion of the cured adhesive by laser cutting.

In an embodiment of the present disclosure, the removing the superfluous portion of the cured adhesive to obtain the adhesive layers comprises removing the superfluous portion of the cured adhesive by laser cutting; and an aluminum film covers a side surface, facing towards the backlight module, of a part of the transparent cover plate corresponding to a kerf to be formed by cutting the adhesive.

In an embodiment of the present disclosure, the method further comprises: before applying the adhesive in the adhesive application regions, cutting the edges of the upper polarization filter protruding beyond the liquid crystal cell, such that the widths of the edges of the upper polarization filter protruding beyond the liquid crystal cell are less than or equal to the selected value; and adhering a transparent cover plate on a side of the upper polarization filter facing away from the liquid crystal cell, and forming a backlight module protecting layer on a side of the backlight module facing away from the liquid crystal cell, such that edges, which correspond to the edges of the upper polarization filter protruding beyond the liquid crystal cell, of the backlight module protecting layer protrude beyond the backlight module, and the applying the adhesive in the adhesive application regions comprises applying, in each of the adhesive application regions, an adhesive having a thickness in the range of 0.3 mm to 0.5 mm, the removing the superfluous portion of the cured adhesive to obtain the adhesive layers comprises removing the superfluous portion of the cured adhesive by an adhesive scraping process, and the method further comprises removing the backlight module protecting layer after removing the superfluous portion of the cured adhesive by the adhesive scraping process.

In an embodiment of the present disclosure, in the applying the adhesive in the adhesive application regions, the transparent cover plate is provided with a pressing force directed towards the backlight module, and the backlight module is provided with a pressing force directed towards the upper polarization filter.

In an embodiment of the present disclosure, when removing the superfluous portion of the cured adhesive by means of the adhesive scraping process, a thickness of a residual portion of the cured adhesive is monitored by a laser distance measuring process.

DETAILED DESCRIPTION OF THE EMBODIMENTS

A further description of the present disclosure will be made in detail as below with reference to embodiments of the present disclosure taken in conjunction with the accompanying drawings. The following embodiments are intended to explain the present disclosure and the present disclosure should not be construed as being limited to the embodiments set forth herein.

Embodiments of the present disclosure provide a display apparatus and a method of manufacturing the display apparatus. With the display apparatus, it is not necessary to dispose a black adhesive tape between a display panel and a backlight module to bond them, but the display panel and the backlight module are bonded by adhesive layers formed on side surfaces. Thereby, a width of a frame of the display apparatus is no longer limited by a width of the black adhesive tape. As a result, the frame of the display apparatus can be manufactured to have a narrower width, which is favorable for achieving a narrow-frame design of the display apparatus.

Figure 1:
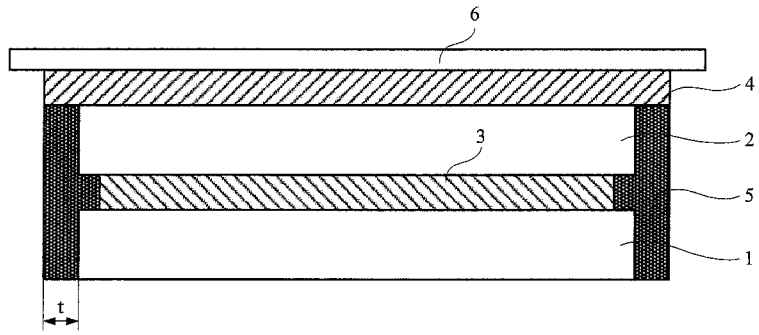
FIG. 1 is a schematic view showing a structure of a display apparatus according to an embodiment of the present disclosure.

Please refer to FIG. 1, a display apparatus according to an embodiment of the present disclosure comprises a display module. The display module comprises a display panel and a backlight module 1 overlapping each other. The display panel comprises a liquid crystal cell 2, a lower polarization filter 3 located on a side of the liquid crystal cell 2 facing towards the backlight module 1, and a layer which is located on a side of the liquid crystal cell 2 facing away from the backlight module 1 and of which at least a pair of edges protrude beyond the liquid crystal cell 2. Adhesive layers 5 are disposed on side surfaces of the display module where the edges of the layer protrude beyond the liquid crystal cell 2. In any one of the side surfaces of the display module where the adhesive layers 5 are disposed, the adhesive layer 5 is adhered to a side surface of the backlight module 1, a side surface of the lower polarization filter 3, a side surface of the liquid crystal cell 2, and a surface, facing towards the backlight module 1, of the edge of the layer protruding beyond the liquid crystal cell 2, and has a thickness tin a direction perpendicular to the side surface of the liquid crystal cell 2 to which the adhesive layer is adhered, and the thickness t is less than or equal to a selected thickness.

In the abovementioned display apparatus, it is not necessary to dispose a black adhesive tape between the display panel and the backlight module 1 to bond them, but the display panel and the backlight module 1 are bonded by the adhesive layers 5 formed on the side surfaces of the liquid crystal cell 2, the side surfaces of the lower polarization filter 3, the side surfaces of the backlight module 1, and the surfaces, facing towards the backlight module 1, of the edges of the layer protruding beyond the liquid crystal cell 2. Thereby, a width of a frame of the display apparatus is no longer limited by a width of the black adhesive tape. As a result, the frame of the display apparatus can be manufactured to have a narrower width, which is favorable for achieving a narrow-frame design of the display apparatus.

In order to further achieve the narrow-frame design of the display apparatus, as shown in FIG. 1, for each adhesive layer 5 of the display apparatus, the selected thickness may be 0.1 mm.

In an embodiment, referring to FIG. 1. the display panel further comprises an upper polarization filter 4 located on a side of the liquid crystal cell 2 facing away from the backlight module 1, and the layer is the upper polarization filter 4.

In another embodiment, as shown in FIG. 1, the display panel further comprises an upper polarization filter 4 and a transparent cover plate 6 which are located on a side of the liquid crystal cell 2 facing away from the backlight module 1, the transparent cover plate 6 is located on a side of the upper polarization filter 4 facing away from the liquid crystal cell 2 and the layer is the transparent cover plate 6. The transparent cover plate 6 may be a glass cover plate.

In an embodiment, as shown in FIG. 1, in any one of the side surfaces of the display module where the adhesive layers 5 are disposed, when an edge of the upper polarization filter 4 protrudes beyond the liquid crystal cell 2 and the upper polarization filter 4 serves as the layer, the upper polarization filter 4 protrudes beyond the liquid crystal cell 2 by a width which is less than or equal to 0.1 mm.

When the edges of the upper polarization filter 4 do not protrude beyond the liquid crystal cell 2 and the transparent cover plate 6 serves as the layer, in any one of the side surfaces of the display module where the adhesive layers 5 are disposed, an edge of the transparent cover plate 6 protrudes beyond the liquid crystal cell 2 by a width which may be in the range of 0.3 mm to 0.5 mm. For example, the width by which the edge of the transparent cover plate 6 protrudes beyond the liquid crystal cell 2 may be 0.3 mm, 0.35 mm, 0.4 mm or 0.5 mm.

In embodiments of the present disclosure, in any one of the side surfaces of the display module where the adhesive layers 5 are disposed, the liquid crystal cell 2 protrudes beyond a side surface of the backlight module 1 by a width which may be 0.1 mm. In an embodiment, the adhesive layers 5 for the display apparatus may be a hot melt adhesive or an ultraviolet curable adhesive, for example a polyester hot melt adhesive, a polyamide hot melt adhesive, a polyethylene hot melt adhesive, an EVA (Ethylene Viny Acetate) hot melt adhesive, a water-based hot melt adhesive, a pressure sensitive hot melt adhesive, and the like. Of course, the adhesive may also be other types of adhesive that meet the requirement, and the other types of adhesive are no longer listed one by one herein.

Figure 2:
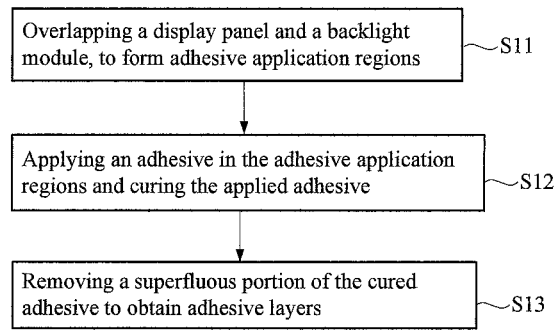
FIG. 2 is a process flow diagram of a method of manufacturing a display apparatus according to an embodiment of the present disclosure.
Figure 3:
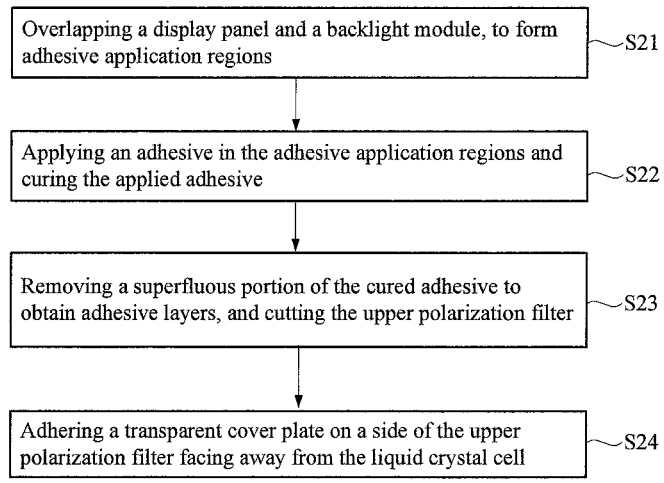
FIG. 3 is a specific process flow diagram of the method shown in FIG. 2.
Figure 4:
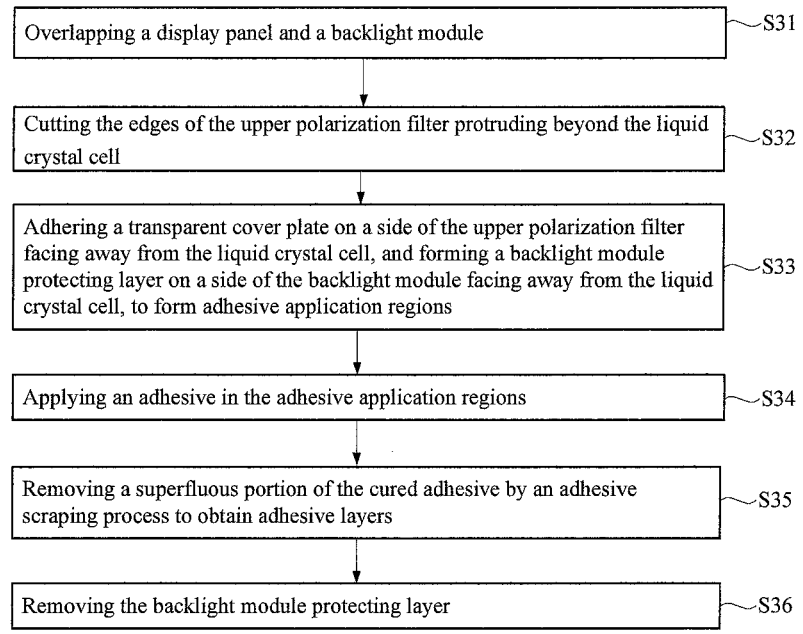
FIG. 4 is another specific process flow diagram of a method of manufacturing a display apparatus according to an embodiment of the present disclosure.
Figure 5A:
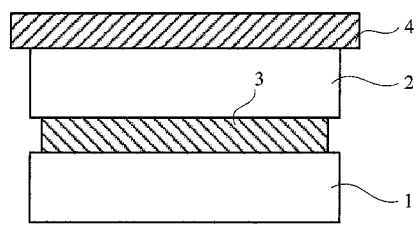
FIGS. 5a to 5d are views showing structures corresponding to an embodiment of a method of manufacturing a display apparatus according to the present disclosure.
Figure 5B:
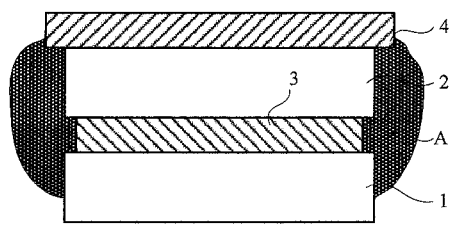
Figure 5C:
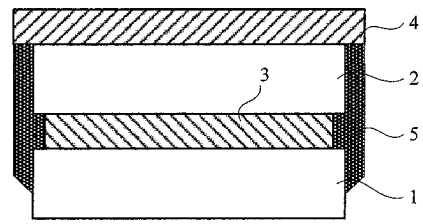

As shown in FIG. 2, embodiments of the present disclosure also provide a method of manufacturing the display substrate according to any one of the above embodiments. The method comprises:

a step S11 of overlapping a display panel and a backlight module 1, wherein, the display panel comprises a liquid crystal cell 2, a lower polarization filter 3 located on a side of the liquid crystal cell 2 facing towards the backlight module 1, and a layer which is located on a side of the liquid crystal cell 2 facing away from the backlight module 1 and of which at least a pair of edges protrude beyond the liquid crystal cell 2, and surfaces, facing towards the backlight module 1 side, of the edges of the layer protruding beyond the liquid crystal cell 2, and side surfaces of the liquid crystal cell 2 and of the backlight module 1 form adhesive application regions, as shown in FIG. 5*a*;

a step S12 of applying an adhesive A in the adhesive application regions and curing the applied adhesive A such that the cured adhesive A is adhered to the side surfaces of the backlight module 1, side surfaces of the lower polarization filter 3, the side surfaces of the liquid crystal cell 2, and the surfaces, facing towards the backlight module 1 side, of the edges of the layer protruding beyond the liquid crystal cell 2, as shown in FIG. 5*b*; and a step S13 of removing a superfluous portion of the cured adhesive A to obtain adhesive layers 5, wherein each of the adhesive layers 5 has a thickness tin a direction perpendicular to the side surface of the liquid crystal cell 2 to which the each of the adhesive layers 5 is adhered, and the thickness t is less than or equal to a selected thickness, as shown in FIG. 5*c*.

When a display apparatus is manufactured by the manufacturing method, first of all the display panel and the backlight module 1 are overlapped together; then the adhesive A is applied in the adhesive application regions formed between the surfaces, facing towards the backlight module 1 side, of the edges of the layer protruding beyond the liquid crystal cell 2, and the side surfaces of the liquid crystal cell 2, of the lower polarization filter 3, and of the backlight module 1; and then the applied adhesive A is cured such that the side surfaces of the backlight module 1, the side surfaces of the lower polarization filter 3, the side surfaces of the liquid crystal cell 2, and the surfaces, facing towards the backlight module 1 side, of the edges of the layer protruding beyond the liquid crystal cell 2 are bonded together by the cured adhesive A; and finally the superfluous portion of the cured adhesive A is removed to obtain the adhesive layers 5, so that each of the adhesive layers 5 has the thickness tin the direction perpendicular to the side surface of the liquid crystal cell 2 to which the each of the adhesive layers 5 is adhered, and the thickness t is less than or equal to the selected thickness.

In the display apparatus manufactured by the manufacturing method, the layer, the liquid crystal cell 2, the lower polarization filter 3 and the backlight module 1 are bonded together by the adhesive layers 5 formed by curing the adhesive A, without needing a black adhesive tape, and the superfluous portion of the cured adhesive A can be removed. Thereby, a width of a frame of the display apparatus is no longer limited by a width of the black adhesive tape. Therefore, the display apparatus manufactured by the manufacturing method is favorable for achieving a narrow-frame design.

In the display apparatus manufactured by the manufacturing method, the layer may be the upper polarization filter 4 or the transparent cover plate 6, and the manufacturing method may comprise a plurality of specific manufacturing methods.

First Manufacturing Method

When the layer of the display apparatus is the upper polarization filter 4, the edge of the upper polarization filter 4 protruding beyond the liquid crystal cell 2 has an initial width of 0.3 mm, and as shown in FIG. 3 and FIGS. 5a-5d, the manufacturing method may comprise the following specific steps.

In step S21, the display panel and the backlight module 1 are overlapped as shown in FIG. 5a. The display panel comprises a liquid crystal cell 2, a lower polarization filter 3 located on a side of the liquid crystal cell 2 facing towards the backlight module 1, and an upper polarization filter 4 which is located on a side of the liquid crystal cell 2 facing away from the backlight module 1 and of which at least a pair of edges protrude beyond the liquid crystal cell 2. Adhesive application regions are formed on surfaces, facing towards the backlight module 1 side, of the edges of the upper polarization filter 4 protruding beyond the liquid crystal cell 2, and side surfaces of the liquid crystal cell 2, of the lower polarization filter 3, and of the backlight module 1.

In step S22, an adhesive A is applied in the adhesive application regions and the applied adhesive A is cured such that the cured adhesive A is adhered to the side surfaces of the backlight module 1, the side surfaces of the lower polarization filter 3, the side surfaces of the liquid crystal cell 2, and the surfaces, facing towards the backlight module 1 side, of the edges of the upper polarization filter 4 protruding beyond the liquid crystal cell 2, as shown in FIG. 5b. The adhesive A applied in each of the adhesive application regions has a thickness in a direction perpendicular to the side surface, corresponding to the each of the adhesive application regions, of the liquid crystal cell 2, and the thickness is in the range of 0.3 mm to 0.5 mm. An actually applied adhesive A may have a thickness of 0.3 mm, 0.35 mm, 0.4 mm or 0.5 mm.

In step S23, the upper polarization filter 4 is cut while removing a superfluous portion of the cured adhesive A to obtain adhesive layers 5, such that the edges of the upper polarization filter 4 protruding beyond the liquid crystal cell 2 have a width which is less than or equal to a selected value, as shown in FIG. 5c. Each of the adhesive layers 5 has a thickness t in a direction perpendicular to the side surface of the liquid crystal cell 2 to which the each of the adhesive layers 5 is adhered, and the thickness t is less than or equal to a selected thickness.

Figure 5D:
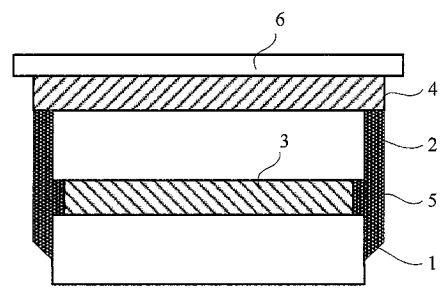

In step S24, a transparent cover plate 6 is adhered on a side of the upper polarization filter 4 facing away from the liquid crystal cell 2, as shown in FIG. 5d.

In an embodiment, in order to ensure product quality of the display apparatus and prevent the adhesive from permeating among the upper polarization filter 4, the liquid crystal cell 2, the lower polarization filter 3 and the backlight module 1 of the display apparatus when applying the adhesive, in the step S22 in which the adhesive is applied in the adhesive application regions, the upper polarization filter 4 is provided with a pressing force directed towards the backlight module 1, and the backlight module 1 is provided with a pressing force directed towards the upper polarization filter 4.

Second Manufacturing Method

When the layer of the display apparatus is the upper polarization filter 4, as shown in FIG. 4 and FIGS. 6a-6f, the manufacturing method may comprise the following specific steps.

Figure 6A:
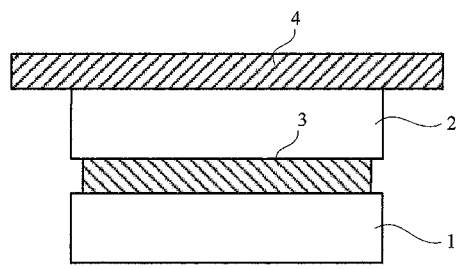
FIGS. 6a to 6f are views showing structures corresponding to another embodiment of the method of manufacturing the display apparatus according to the present disclosure.

In step S31, the display panel and the backlight module 1 are overlapped, as shown in FIG. 6a. The display panel comprises a liquid crystal cell 2, a lower polarization filter 3 located on a side of the liquid crystal cell 2 facing towards the backlight module 1, and an upper polarization filter 4 which is located on a side of the liquid crystal cell 2 facing away from the backlight module 1 and of which at least a pair of edges protrude beyond the liquid crystal cell 2.

Figure 6B:
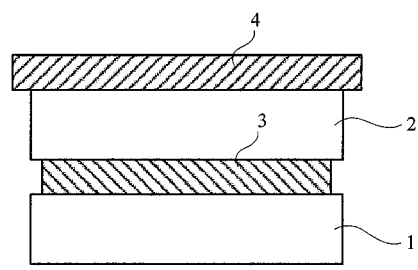

In step S32, the edges of the upper polarization filter 4 protruding beyond the liquid crystal cell 2 are cut such that the widths of the edges of the upper polarization filter 4 protruding beyond the liquid crystal cell 2 are less than or equal to the selected value, as shown in FIG. 6b.

Figure 6C:
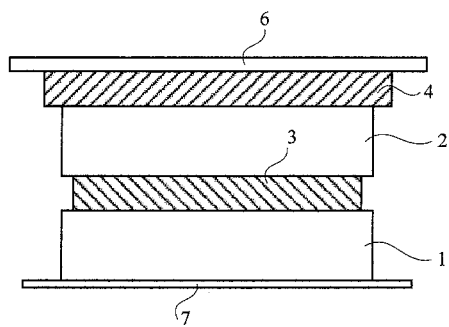

In step S33, a transparent cover plate 6 is adhered on a side of the upper polarization filter 4 facing away from the liquid crystal cell 2, and a backlight module protecting layer 7 is formed on a side of the backlight module 1 facing away from the liquid crystal cell 2, such that edges, which correspond to the edges of the upper polarization filter 4 protruding beyond the liquid crystal cell 2, of the backlight module protecting layer 7 protrude beyond the backlight module 1. Adhesive application regions are formed on surfaces, facing towards the backlight module 1 side, of the edges of the upper polarization filter 4 protruding beyond the liquid crystal cell 2, side surfaces of the liquid crystal cell 2, of the lower polarization filter 3, and of the backlight module 1, and surfaces, facing towards the liquid crystal cell 2 side, of the edges of the backlight module protecting layer 7, as shown in FIG. 6c.

Figure 6D:
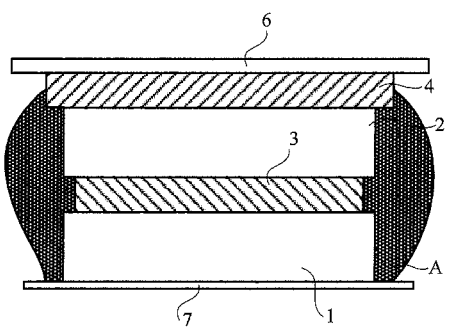

In step S34, an adhesive A is applied in the adhesive application regions and the applied adhesive A is cured such that the cured adhesive A is adhered to the side surfaces of the backlight module 1, the side surfaces of the lower polarization filter 3, the side surfaces of the liquid crystal cell 2, the surfaces, facing towards the backlight module 1 side, of the edges of the upper polarization filter 4 protruding beyond the liquid crystal cell 2, and the surfaces, facing towards the liquid crystal cell 2 side, of the edges of the backlight module protecting layer 7, as shown in FIG. 6d. The adhesive A applied in each of the adhesive application regions has a thickness in a direction perpendicular to the side surface, corresponding to the each of the adhesive application regions, of the liquid crystal cell 2, and the thickness is in the range of 0.3 mm to 0.5 mm. An actually applied adhesive A may have a thickness of 0.3 mm, 0.35 mm, 0.4 mm or 0.5 mm.

Figure 6E:
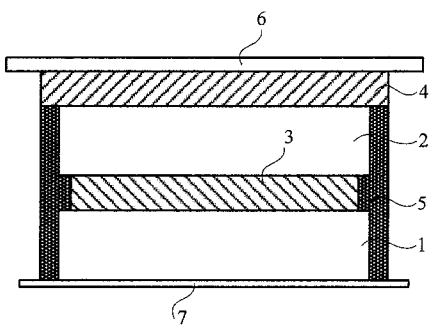

In step S35, a superfluous portion of the cured adhesive A is removed by an adhesive scraping process to obtain adhesive layers 5, as shown in FIG. 6e. Each of the adhesive layers 5 has a thickness t in a direction perpendicular to the side surface of the liquid crystal cell 2 to which the each of the adhesive layers 5 is adhered, and the thickness t is less than or equal to a selected thickness.

Figure 6F:
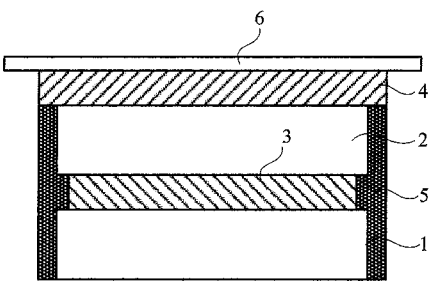

In step S36, the backlight module protecting layer 7 is removed, as shown in FIG. 6f.

In the second manufacturing method, in an embodiment, in order to ensure product quality of the display apparatus and prevent the adhesive A from permeating among components of the display apparatus when applying the adhesive, in the step S34 in which the adhesive A is applied in the adhesive application regions, the transparent cover plate 6 is provided with a pressing force directed towards the backlight module 1, and the backlight module 1 is provided with a pressing force directed towards the upper polarization filter 4.

The manufacturing method comprises the step S33 in which the backlight module protecting layer 7 is formed on the side of the backlight module 1 facing away from the liquid crystal cell 2, so that during production, the backlight module 1 can be protected by the backlight module protecting layer 7. Therefore, the manufacturing method can improve both product quality of the display apparatus and a product qualification ratio.

In step S35 in which the superfluous portion of the cured adhesive A is removed by the adhesive scraping process, a thickness of a residual portion of the cured adhesive A is monitored by a laser distance measuring process. The laser distance measuring has a high distance measuring accuracy. Therefore, while monitoring the thickness of the residual portion of the cured adhesive A in real time, the thickness of the residual portion of the cured adhesive A can be caused to meet a production requirement, and a manufacturing accuracy of the adhesive layers 5 of the display apparatus is further ensured.

Third Manufacturing Method

The layer of the display apparatus may also be the transparent cover plate 6, and the upper polarization filter 4 is disposed between the transparent cover plate 6 and the liquid crystal cell 2. As shown in FIG. 2 and FIGS. 7a-7d, the manufacturing method may comprise the following specific steps.

Figure 7A:
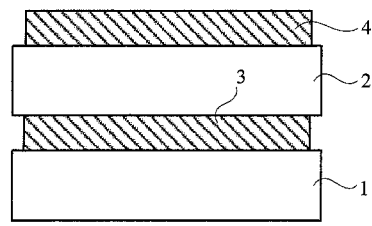
FIGS. 7a to 7d are views showing structures corresponding to a further embodiment of the method of manufacturing the display apparatus according to the present disclosure.
Figure 7B:
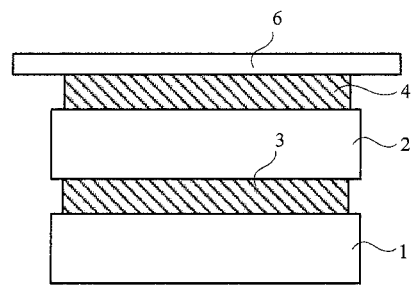

In step S11, the display panel and the backlight module 1 are overlapped. The display panel comprises a liquid crystal cell 2, a lower polarization filter 3 located on a side of the liquid crystal cell 2 facing towards the backlight module 1, an upper polarization filter 4 located on a side of the liquid crystal cell 2 facing away from the backlight module 1, and a transparent cover plate 6 which is located on a side of the upper polarization filter 4 facing away from the backlight module 1 and of which at least a pair of edges protrude beyond the liquid crystal cell 2. Adhesive application regions are formed by cooperation of surfaces, facing towards the backlight module 1 side, of the edges of the transparent cover plate 6 protruding beyond the liquid crystal cell 2, and side surfaces of the upper polarization filter 4, of the liquid crystal cell 2, of the lower polarization filter 3, and of the backlight module 1, as shown in FIG. 7a and FIG. 7b.

Figure 7C:
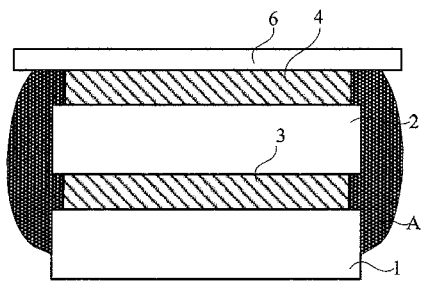

In step S12, an adhesive A is applied in the adhesive application regions and the applied adhesive A is cured such that the cured adhesive A is adhered to the side surfaces of the backlight module 1, the side surfaces of the lower polarization filter 3, the side surfaces of the liquid crystal cell 2, the side surfaces of the upper polarization filter 4, and the surfaces, facing towards the backlight module 1 side, of the edges of the transparent cover plate 6 protruding beyond the liquid crystal cell 2, as shown in FIG. 7c. The adhesive A applied in each of the adhesive application regions has a thickness in a direction perpendicular to the side surface, corresponding to the each of the adhesive application regions, of the liquid crystal cell 2, and the thickness is in the range of 0.3 mm to 0.5 mm. An actually applied adhesive A may have a thickness of 0.3 mm, 0.35 mm, 04 mm or 0.5 mm.

Figure 7D:
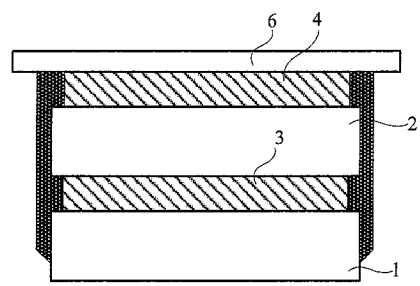

In step S13, a superfluous portion of the cured adhesive A is removed to obtain adhesive layers 5. Each of the adhesive layers 5 has a thickness tin a direction perpendicular to the side surface of the liquid crystal cell 2 to which the each of the adhesive layers 5 is adhered, and the thickness t is less than or equal to a selected thickness, as shown in FIG. 7d.

In the third manufacturing method, the superfluous portion of the cured adhesive A is removed by laser cutting. The laser cutting technology has characteristics of good cutting quality, high cutting speed, and high cutting efficiency. Therefore, the superfluous portion of the cured adhesive A is removed by the laser cutting technology, and accordingly, the product quality of the display apparatus and production efficiency can be improved. In addition, in order to protect the transparent cover plate 6 during the laser cutting, an aluminum film covers a side surface, facing towards the backlight module 1, of the edge of the transparent cover plate 6 corresponding to a kerf to be formed by cutting the adhesive A.

In the display apparatus according to the embodiments of the present disclosure, it is not necessary to dispose a black adhesive tape between the display panel and the backlight module to bond them, but the display panel and the backlight module are bonded by the adhesive layers formed on the side surfaces of the liquid crystal cell, the side surfaces of the lower polarization filter, the side surfaces of the backlight module, and the surfaces, facing towards the backlight module, of the edges of the layer protruding beyond the liquid crystal cell. Thereby, a width of a frame of the display apparatus is no longer limited by a width of the black adhesive tape. As a result, the frame of the display apparatus can be manufactured to have a narrower width, which is favorable for achieving a narrow-frame design of the display apparatus.

The above embodiments are only used to explain the present disclosure, and should not be construed to limit the present disclosure. It will be understood by those skilled in the art that various changes and modifications may be made therein without departing from the spirit of the present disclosure, the scope of which is defined in the appended claims and their equivalents.

What is claimed is:

1. A method of manufacturing a display apparatus, the method comprising:

overlapping a display panel and a backlight module, wherein: the display panel comprises a liquid crystal cell, a lower polarization filter located on a side of the liquid crystal cell facing towards the backlight module, and an upper polarization filter which is located on a side of the liquid crystal cell facing away from the backlight module and of which at least a pair of edges protrude beyond the liquid crystal cell;

cutting the edges of the upper polarization filter protruding beyond the liquid crystal cell, such that widths of the edges of the upper polarization filter protruding beyond the liquid crystal cell are less than or equal to a selected value;

forming a backlight module protecting layer on a side of the backlight module facing away from the liquid crystal cell, such that edges, which correspond to the edges of the upper polarization filter protruding beyond the liquid crystal cell, of the backlight module protecting layer protrude beyond the backlight module, wherein adhesive application regions are formed by surfaces, facing towards the backlight module side, of the edges of the upper polarization filter protruding beyond the liquid crystal cell, side surfaces of the liquid crystal cell, of the lower polarization filter, and of the backlight module, and surfaces, facing towards the liquid crystal cell side, of the edges of the backlight module protecting layer protruding beyond the backlight module;

applying, in each of the adhesive application regions, an adhesive having a thickness in the range of 0.3 mm to 0.5 mm;

curing the applied adhesive such that the cured adhesive is adhered to the surfaces, facing towards the liquid crystal cell side, of the edges of the backlight module protecting layer protruding beyond the backlight module, the side surfaces of the backlight module, the side surfaces of the lower polarization filter, the side surfaces of the liquid crystal cell, and the surfaces, facing towards the backlight module side, of the edges of the upper polarization filter protruding beyond the liquid crystal cell; and removing, by an adhesive scraping process, a superfluous portion of the cured adhesive to obtain adhesive layers, wherein each of the adhesive layers has a thickness in a direction perpendicular to the side surface of the liquid crystal cell to which the each of the adhesive layers is adhered, and the thickness is less than 0.1 mm.

2. The method of claim 1, wherein:
the display panel further comprises a transparent cover plate which is located on a side of the upper polarization filter facing away from the liquid crystal cell.

3. The method of claim 2, wherein:
in the applying the adhesive in the adhesive application regions, the transparent cover plate is provided with a pressing force directed towards the backlight module, and the backlight module is provided with a pressing force directed towards the upper polarization filter.

4. The method of claim 1, further comprising:
after the cutting the edges of the upper polarization filter protruding beyond the liquid crystal cell,
adhering a transparent cover plate on a side of the upper polarization filter facing away from the liquid crystal cell; and
removing the backlight module protecting layer after the removing the superfluous portion of the cured adhesive by the adhesive scraping process.

5. The method of claim 1, wherein:
in the removing the superfluous portion of the cured adhesive by the adhesive scraping process, a thickness of a residual portion of the cured adhesive is monitored by a laser distance measuring process.

* * * * *